United States Patent [19]
Ono

[11] Patent Number: 5,402,371
[45] Date of Patent: Mar. 28, 1995

[54] METHOD OF WRITING DATA INTO AND ERASING THE SAME FROM SEMICONDUCTOR NONVOLATILE MEMORY

[75] Inventor: Takashi Ono, Tokyo, Japan

[73] Assignee: Oki Electric Industry Co., Ltd., Tokyo, Japan

[21] Appl. No.: 132,952

[22] Filed: Oct. 7, 1993

[30] Foreign Application Priority Data

Oct. 9, 1992 [JP] Japan .................. 4-271379

[51] Int. Cl.⁶ .................................. G11C 11/40
[52] U.S. Cl. ............................ 365/185; 365/218; 257/322
[58] Field of Search .............. 365/104, 185, 218, 900; 257/314, 316, 320, 322

[56] References Cited

U.S. PATENT DOCUMENTS

| | | | |
|---|---|---|---|
| 5,045,491 | 9/1991 | Gill et al. | 437/52 |
| 5,168,465 | 12/1992 | Harari | 365/185 X |
| 5,235,544 | 8/1993 | Caywood | 365/185 |
| 5,280,446 | 1/1994 | Ma et al. | 365/185 |

FOREIGN PATENT DOCUMENTS 2235088 2/1991 United Kingdom .

OTHER PUBLICATIONS

K. Naruke et al, "A New Flash-Erase EEPROM Cell With a Sidewall Select-Gate on its Source Side", IEDM, 1989, pp. 603-606.

Electronic Design, vol. 31, No. 17, Aug., 1993; pp. 189-196; "EEPROM Adapts Easily to In-System Changes", F. Jones et al.

Primary Examiner—Joseph A. Popek
Attorney, Agent, or Firm—Spencer, Frank & Schneider

[57] ABSTRACT

The present invention provides a method of writing data into and erasing it from a semiconductor nonvolatile memory having two diffusion layers formed in a semiconductor substrate, a floating gate formed on a layer between the two diffusion layers, a control gate and a select gate formed on a side portion of the control gate. The method is achieved by applying a potential enabling a channel to be formed between the two diffusion layers to the control gate, applying a potential preventing the channel from being formed therebetween to the select gate, injecting an electric charge into the floating gate without causing current to flow between the diffusion layers and writing data into the semiconductor nonvolatile memory. Thus, when such a method is used, the semiconductor nonvolatile memory can be operated with low energy and the number of times in which the data is reloaded or rewritten can be made greater.

11 Claims, 4 Drawing Sheets

A NUMBER OF TIMES

METHOD OF WRITING DATA INTO AND ERASING THE SAME FROM SEMICONDUCTOR NONVOLATILE MEMORY

BACKGROUND OF THE INVENTION

This invention relates to a semiconductor nonvolatile memory, and particularly to a method of writing data into and erasing it from an electrically data-reloadable semiconductor nonvolatile memory.

As electrically data-reloadable ROMs (Read Only Memory), there has heretofore been proposed various flash EEPROMs (Electrical Erasable and Programmable ROM) memory cells.

For example, a sidewall type flash EEPROM cell has been described in "IEDM 1989 P. 603 to 606 'A New Flash-Erase EEPROM CELL With a Side Nail Select-Gate on its Source Side' K. Naruke et al."

In this type of sidewall type flash EEPROM cell, the writing of data therein effected by injecting hot electrons thereof into a floating gate.

In this case an energy of 3.1 eV or higher is required to write the data in the sidewall type flash EEPROM cell in view of the structure of the sidewall type flash EEPROM cell to be described later.

Further, when the data is written into the cell under such high energy, the number of times in which the data is rewritten or reloaded reaches several thousands or so.

SUMMARY OF THE INVENTION

It is an object of the present invention to provide a method of writing data into and erasing it from a semiconductor nonvolatile memory, wherein a data writing operation can be made with a low energy of 3 V or less and the number of times in which data can be reloaded can be increased.

According to one aspect of the present invention, for achieving the above object, there is provided a method of writing data into a semiconductor nonvolatile memory having first and second diffusion regions, a control gate and floating gate disposed over a first channel region which is located on the first diffusion region, and a select gate disposed over a second channel region which is located between the first channel region and the second diffusion region, the method comprising the steps of:

applying a first potential to the control gate so that the first channel region is inverted;

simultaneously applying a second potential to the select gate so that the second channel region is not inverted; and simultaneously applying a third potential to the first diffusion region so that an electric charge is injected from the first diffusion region into the floating gate through the first channel region.

According to another aspect of the present invention, there is also provided a method of erasing data from a semiconductor nonvolatile memory having a semiconductor substrate region, first and second diffusion region in the semiconductor substrate region, a control gate, a floating gate disposed over a first channel region which is located on the first diffusion region which is located between the first channel region and second diffusion region, the method comprising the step of:

applying a first potential to the control gate; and simultaneously applying to the semiconductor substrate region, a second potential a voltage of which is higher than the first potential so hat an electric charge stored in the floating gate is transferred to the semiconductor substrate region.

DETAILED DESCRIPTION OF THE PREFERRED EMBODIMENTS

Figure 1:
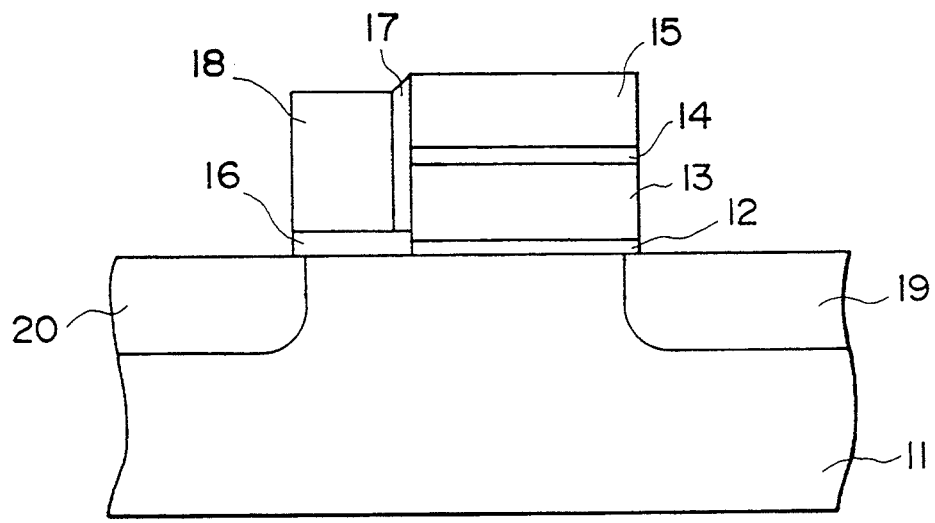
FIG. 1 is a cross-sectional view showing a sidewall type flash EEPROM cell.
Figure 2:
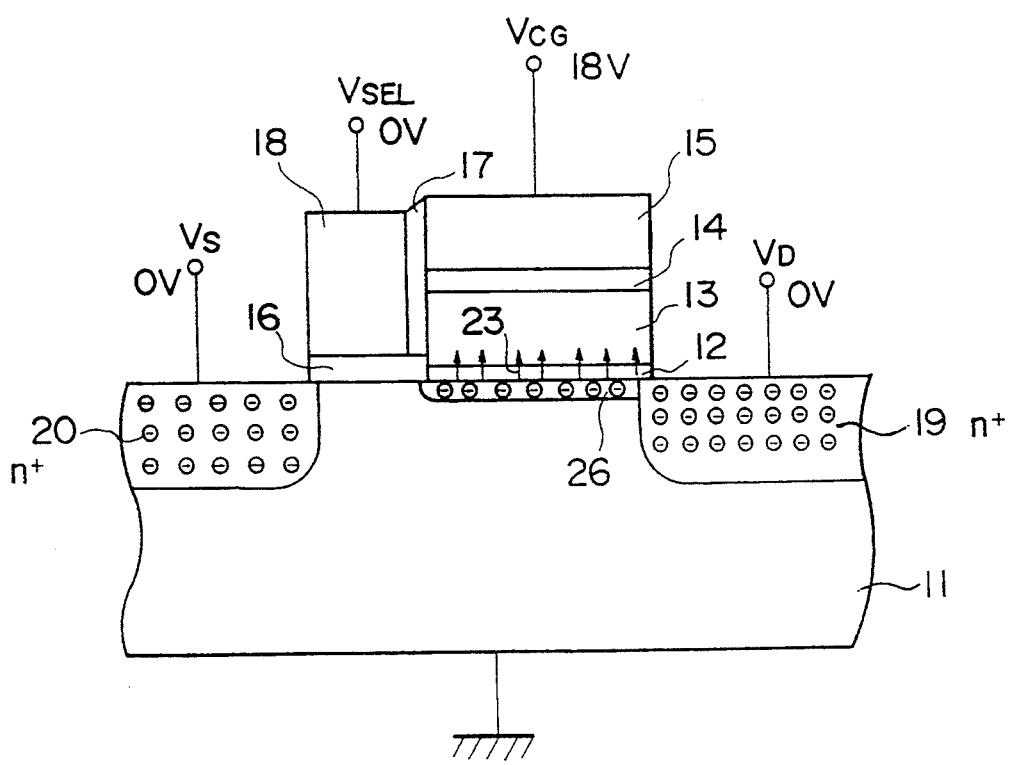
FIG. 2 is a view for describing a first method of writing data into a sidewall type flash EEPROM cell, according to a first embodiment of the present invention.

FIG. 1 is a cross-sectional view showing a sidewall type flash EEPROM cell. FIG. 2 is a view for explaining a first method of writing data into a sidewall type flash EEPROM cell, according to a first embodiment of the present invention.

The configuration of the sidewall type flash EEPROM cell shown in FIG. 1 will first be described. A gate insulative film 12 having a film thickness ranging from 50 Å to 150 Å is formed on a monocrystalline silicon substrate 11. A floating gate 13 composed of polycrystalline silicon is deposited on the gate insulative film 12. Further, an insulative film 14 is formed on the floating gate 13 and a control gate 15 composed of the polycrystalline silicon is fabricated on the insulative film 14.

An insulative film 16 is formed on the monocrystalline silicon substrate 11. A sidewall type select gate 18 made up of the polycrystalline silicon is formed on the insulative film 16. The sidewall type select gate 18 is insulated from the floating gate 13 and the control gate 15 by an insulative film 17.

Next, a drain diffusion layer 19 and a source diffusion layer 20 are formed on the surface of the monocrystalline silicon substrate 11.

The drain diffusion layer 19 is formed on the floating gate 13 side, whereas the source diffusion layer 20 is formed on the select gate 18 side.

The first data writing method according to the present invention will now be described with reference to FIG. 2. FIG. 2 is a cross-sectional view of an N type and sidewall type flash EEPROM cell. N-type impurities are implanted into the drain diffusion layer 19 and the source diffusion layer 20. The same elements of structure as those shown in FIG. 1 are identified by the same reference numerals.

A drain voltage $V_D$ applied to the drain diffusion layer 19, a control gate voltage $V_{CG}$ applied to the control gate 15, a select gate voltage $V_{SEL}$ applied to the select gate 18, a source voltage $V_S$ applied to the source diffusion layer 20 and a substrate voltage applied to the silicon substrate 11 will be set as 0 V, 18 V, 0 V, 0 V and 0 V respectively. However, the source voltage is not necessarily limited to 0 V. The source voltage may be about 10 V or below or may be in a floating state.

An inversion layer 26 is formed on the surface of the monocrystalline silicon substrate 11 below the floating gate 13 under such applied voltages. The inversion layer 26 is made up of electrons supplied from the drain diffusion layer 19 by a difference in potential between the drain voltage $V_D$ and the control gate voltage $V_{CG}$. The electrons in the inversion layer 26 and those in the drain diffusion layer 19 are attracted to the control gate 15 to which the high voltage ($V_{CG}$) has been applied. Thereafter, these electrons pass through the gate insulative film 12 and are injected into the floating gate 13. The flow of the electrons in the gate insulative film 12 is called "Fowler/Nordheim tunnel current". Arrows in FIG. 1 show a direction of a movement of electrons. Therefore, a direction of the current flow is opposite to the direction of the arrows shown FIG. 2.

Thus, data is written into the sidewall type flash EEPROM cell by injecting the electrons into the floating gate 13.

Figure 3:
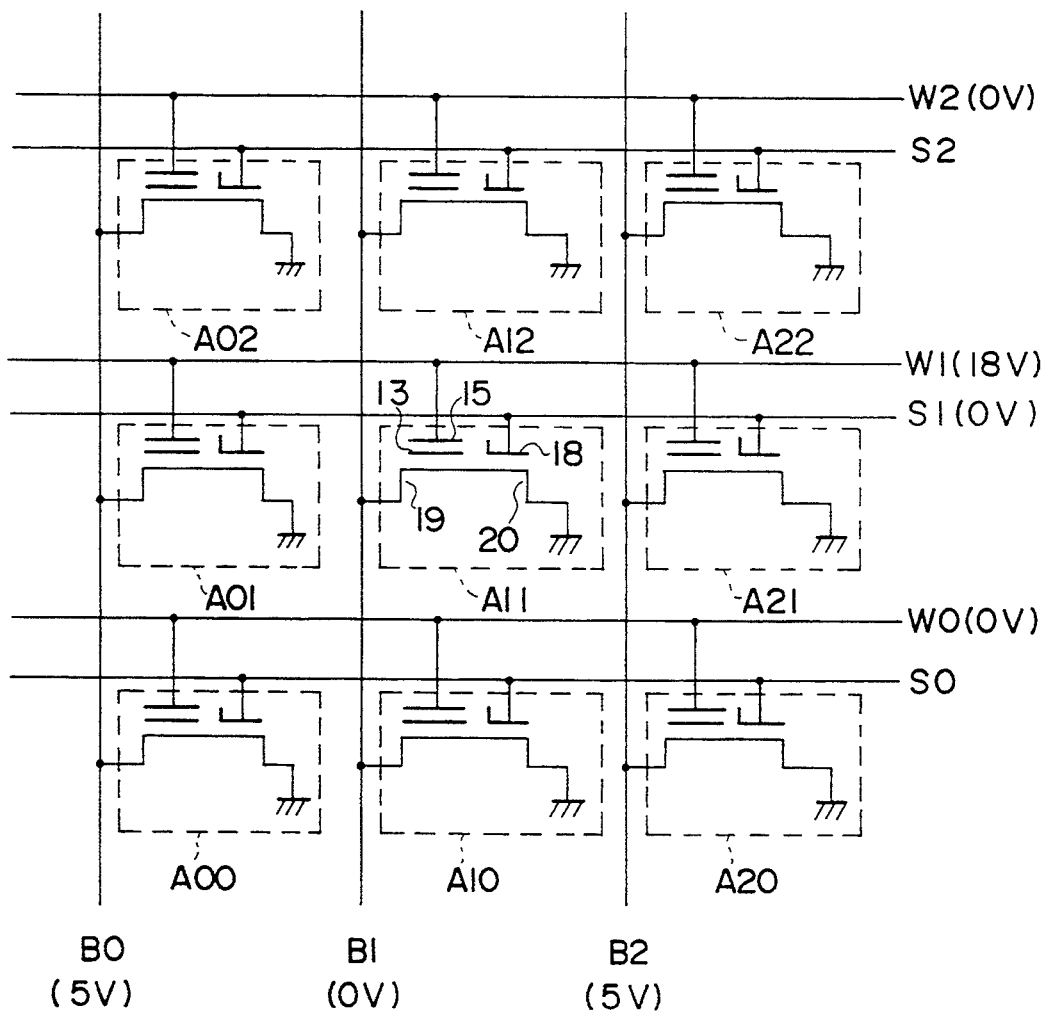
FIG. 3 is a circuit diagram showing a memory device in which a plurality of N type and sidewall type flash EEPROM cells have been arranged.

Further, the above operations will be described in connection with the case where the cell shown in FIG. 2 is arranged in plural form. FIG. 3 is a circuit diagram showing a memory device wherein the N type and sidewall type flash EEPROM cell shown in FIG. 2 is arranged in plural form.

Respective cells A00 through A22 are arranged in the form of a matrix of 3×3, Elements of structure of the cell A11, which correspond to those shown in FIG. 2, are identified by the same reference numerals. Similarly to the cell A11, elements of structure of other respective cells also correspond to those shown in FIG. 2. However, their reference numerals are omitted. The drain diffusion layers 19 of the cells A0X (X=0,1,2) are respectively electrically connected to one another by a bit line B0. The drain diffusion layers 19 of the cells A1X (X=0,1,2) are respectively electrically connected to one another by a bit line B1. The drain diffusion layers 19 of the cells A2X (X=0,1,2) are respectively electrically connected to one another by a bit line B2.

The control gates 15 of the cells AX0 (X=0,1,2) are respectively electrically connected to one another by a word line W0. The control gates 15 of the cells AX1 (X=0,1,2) are respectively electrically connected to one another by a word line W1. Further, the control gates 15 of the cells AX2 (X=0,1,2) are respectively electrically connected to one another by a word line W2.

The select gates 18 of the cell AX0 (X=0,1,2) are respectively electrically connected to one another by a select line S0. The select gates 18 of the cells AX1 (X=0,1,2) are respectively electrically connected to one another by a select line S1. The select gates 18 of the cells AX2 (X=0,1,2) are respectively electrically connected to one another by a select line S2.

The source diffusion layers 20 of the respective cells are grounded. Each of the source diffusion layers 20 may be set to a floating state.

A description will now be made of the case where data is written into the cell A11 of the cells A00 through A22 electrically connected to one another as described above.

Voltages of 0 V, 18 V and 0 V are applied to or across the bit line B1 (selection bit line), the word line W1 (selection word line) and the select line S1 (selection select line) respectively. At this time, the Fowler/Nordheim tunnel current 23 flows in the gate insulative film 12 to store an electric charge in the floating gate 13.

At this time the bit lines B0, B2 (non selection bit lines), the word lines W0, W2 (non selected word lines) and the select lines S0, S2 (non selected select lines) should be respectively supplied with voltages which do not cause variations in the quantity of electric charges already stored in the respective floating gates of the memory cells (A00, A01, A02, A10, A12, A20, A21 and A22) other than the cell A11. The application of the voltages to their corresponding lines will be described below.

The memory cells A10 and A12 are first electrically connected to the selection bit line B1 (0 V). Thus, a voltage of 0 V, for example, which does not cause the gate insulative films 12 of the memory cells A10 and A12 to conduct the Fowler/Nordheim tunnel current 23, is applied to each of the non selected word lines W0 and W2 electrically connected to these memory cells A1 and A12.

Next, the memory cells A01 and A21 are electrically connected to the selection word line W1(18 V). Thus, a voltage, which does not cause the gate insulative films 12 of the memory cells A01 and A21 to conduct the Fowler/Nordheim tunnel current 23, is applied to each of the non selected bit lines B0 and B2 electrically connected to these memory cells A01 and A21. When a voltage of 5 V, for example, is applied to each of the non selected bit lines B0 and B2, the Fowler/Nordheim tunnel current 23 does not flow into the gate insulative films 12 of the memory cells A01 and A02, even if the voltage applied across the selection word line W1 is 18 V.

Thus, when the voltage of 0 V is applied across each of the non selected word lines W0 and W2 and the voltage of 5 V is applied across each of the non selected bit lines B0 and B2, the quantity of the electric charges stored in the floating gates 13 of the memory cells A00, A02, A20 and A22 respectively electrically connected to the non selected word lines and the non selected bit lines does not vary.

The role of the selection select line S1 is to prevent the inversion layer 26 and the source diffusion layer 20 from electrically conducting, the manner of which has been described with reference to FIG. 2. If the voltage applied to the selection select line S1, i.e. the select gate voltage $V_{SEL}$ shown in FIG. 2 is of such a voltage that the inversion layer can be formed on the surface of the monocrystalline silicon substrate 11 below the select gate 18, the source diffusion layer 20 and the drain diffusion layer 19 are brought into a conducting state. Since the source diffusion layer 20 is grounded in this case, the surface of the monocrystalline silicon substrate 11 is brought to 0 V. Since the selection word line W1 is maintained at a high potential of 18 V, the electron flowing between the source diffusion layer and the drain diffusion layer are injected into the floating gate. The movement of the electrons to the floating gate occurs in each of the non selected memory cells A01 and A21 to thereby produce miswriting.

In order to avoid such miswriting, the selection select line S1 is supplied with such a voltage that the inversion layer 26 is electrically disconnected from the source diffusion layer 20. When the select voltage $V_{SEL}$ is 0 V as shown in FIG. 2, for example, the inversion layer 26 is not formed on the surface of the monocrystalline silicon substrate 11 below the select gate 18. As a result, the source diffusion layer and the drain diffusion layer in each of the non selected memory cells A01 and A21 are kept in on conduction. Therefore, the miswriting is no longer produced.

It is thus necessary to take into consideration the voltage applied to the select gate 18 or the width of the select gate 18 so that conducting current does not flow between the source and drain thereof.

Figure 4:
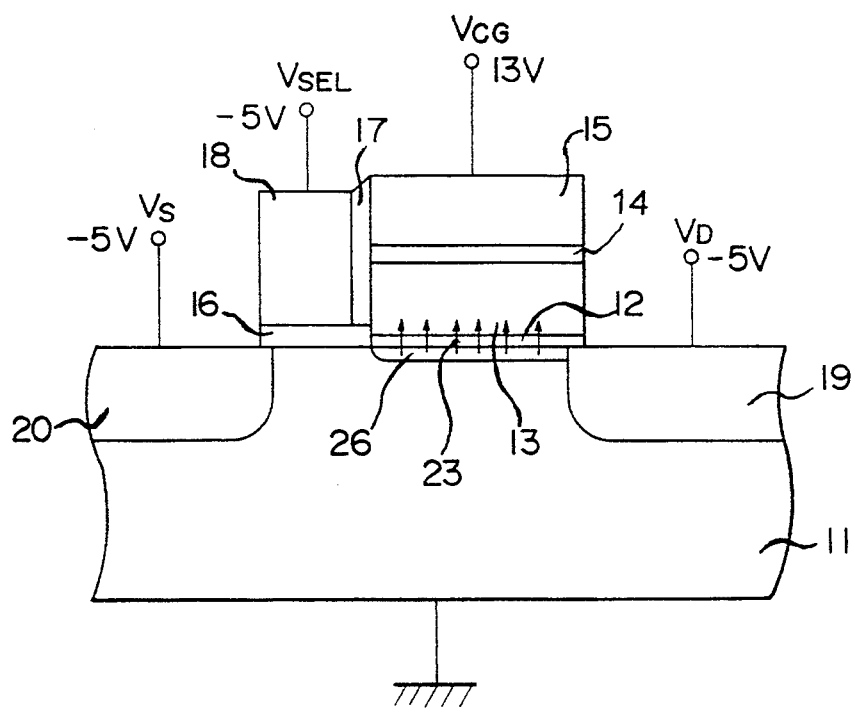
FIG. 4 is a view for describing a second method of writing data into a sidewall type flash EEPROM cell, according to a second embodiment of the present invention.

A second embodiment of the present invention will now be described below. FIG. 4 is a view for describing a second method of writing data into a sidewall type flash EEPROM cell according to the second embodiment of the present invention. FIG. 4 illustrates a well-layer as the silicon substrate 11.

The sidewall type flash EEPROM cell shown in FIG. 4 is identical in structure to that illustrated in FIG. 1. The same elements of structure as those shown in FIG. 1 are identified by the same reference numerals. N-type impurities are implanted into a source diffusion layer and a drain diffusion layer.

The second data writing method according to the present invention will first be described. A drain voltage $V_D$, a control gate voltage $V_{CG}$, a select gate voltage $V_{SEL}$, a source voltage $V_S$ and a well-layer voltage are set to −5 V, 13 V, −5 V, −5 V and −5 V respectively. However, it is difficult to maintain the substrate voltage at −5 V. Therefore, a well-layer voltage $V_W$ applied to the well layer formed within the substrate is set to −5 V.

In a manner similar to the first data writing method which has been with reference to FIG. 2, an inversion layer 26 is formed on the surface of a monocrystalline silicon substrate 11 provided below a floating gate 13 even under the applied voltages referred to above. The inversion layer 26 is made up of electrons supplied from a drain diffusion layer 19 by a difference in potential between the drain voltage $V_D$ and the control gate voltage $V_{CG}$. The drain diffusion layer 19 electrons are attracted at a control gate 15 to which the high voltage ($V_{CG}$) has been applied. Thereafter, these electrons pass through a gate insulative film 12 so and are injected into the floating gate 13.

Thus, data is written into the sidewall type flash EEPROM cell by injecting the electrons into the floating gate 13. Further, the quantity of electric charges stored in the floating gate of each non selected memory cell does not vary due to the setting of the non selected word and bit lines to −5 V and 0 V.

A description will now be made of the case where the sidewall type flash EEPROM cell employed in the present invention can be activated under an applied voltage of 3 V.

In the data writing method according to either first or second embodiment of the present invention, when each of the gate insulative layers 12 shown in FIGS. 2 and 4 ranges in thickness from 60 Å to 100 Å, the difference in potential between the control gate 15 and the drain diffusion layer 19 requires a voltage range of about 12 V to 20 V to produce the Fowler/Nordheim tunnel current 23. This potential difference is large as compare with the case where data is written under the action of the conventionally-used hot electrons. However, when it is desired to write data using the Fowler/Nordheim tunnel current, the required amount of current is much less because of several pAmps per cell. Thus, even, if an external power source is of 3 V, the required current can be produced by an internal booster circuit. Since data represented in the form of 10 kbits or so can be written at one time if the internal boosting capability of the internal booster circuit is rated to 10 μA, the data can be written at a high speed.

Figure 5:
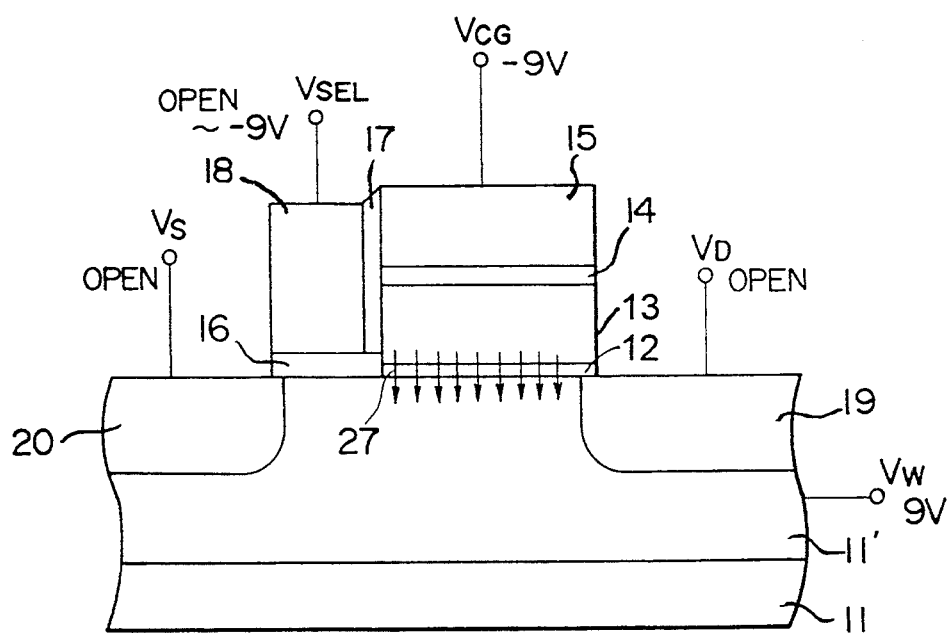
FIG. 5 is a view for describing a method of erasing data from a sidewall type flash EEPROM cell, according to a third embodiment of the present invention.

A description will next be made of a method of erasing data. FIG. 5 is a view for describing a method of erasing data from a sidewall type flash EEPROM cell, according to a third embodiment of the present invention.

The sidewall type flash EEPROM cell illustrated in FIG. 5 is substantially identical in structure to that shown in FIG. 1. However, reference numeral 11' indicates a P-type well layer formed within a monocrystalline silicon substrate 11. Components of the sidewall type flash EEPROM cell shown in FIG. 5, which correspond to those of the sidewall type flash EEPROM shown in FIG. 1, are identified by like reference numerals. N-type impurities are implanted into a source diffusion layer and a drain diffusion layer.

A drain voltage $V_D$, a select gate voltage $V_{SEL}$ and a source voltage $V_S$ are respectively set to an open state. Further, a control gate voltage $V_{CG}$ and a well-layer voltage $V_W$ applied to the well layer 11' formed within the monocrystalline substrate 11 are set to −9 V and 9 V respectively.

In this condition, Fowler/Nordheim tunnel current 27 flows from the substrate to the floating gate through a gate insulative film 12. Therefore, the electrons stored in the floating gate 13 move into the surface of the monocrystalline silicon substrate 11 through the gate insulative film 12. This function is called "erasing data".

According to the data erasing method of the present invention as described above, the electric charge stored in the floating gate 13 can be transferred over the entire surface of the monocrystalline silicon substrate 11. As a result, a large current does not flow locally and the gate insulative film can be prevented from deterioration. Further, the number of times in which data is rewritten or reloaded can also be increased.

Figure 6:
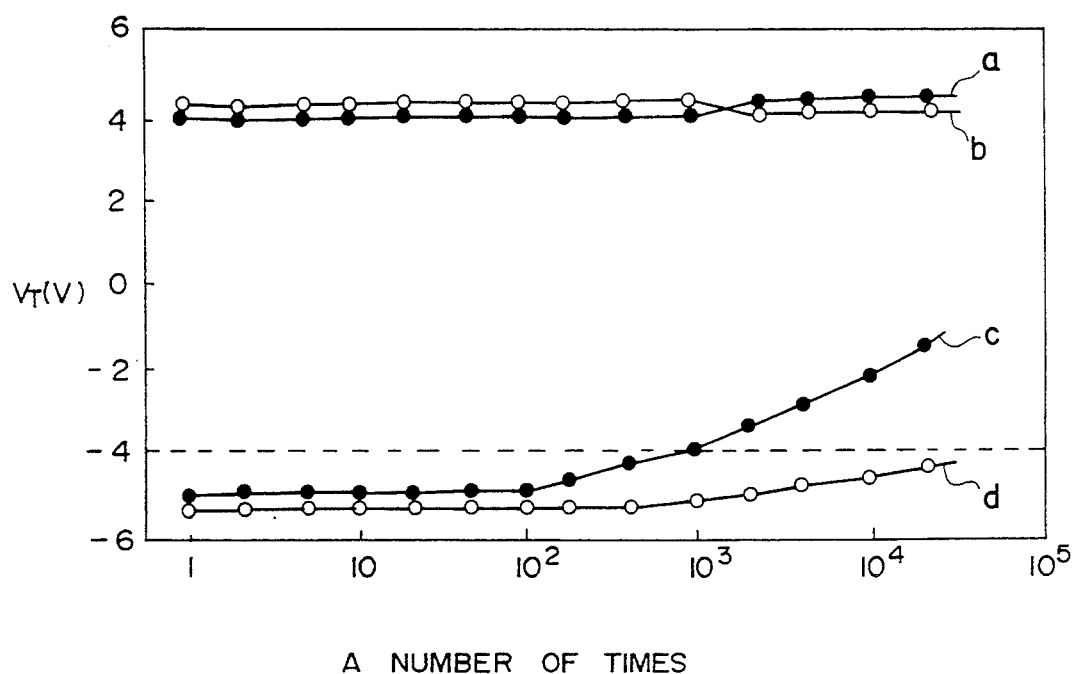
FIG. 6 is a graph for describing the relationship between the number of times in which data is repeatedly written and erased and a threshold voltage ($V_T$) at the time that data is written under the action of conventional hot electrons and data is written into the sidewall type flash EEPROM cell according to the first embodiment of the present invention.

FIG. 6 is a graph for describing the relationship between the number of times in which data is repeatedly written and erased and a threshold voltage ($V_T$) at the time that data is written under the action of the conventional hot electrons and data is written into the sidewall type flash EEPROM cell employed in the first embodiment of the present invention. Here, the threshold voltage ($V_T$) represents a voltage at the time that current begins to flow between the source diffusion layer and the drain diffusion layer when the voltage applied to the control gate is varied. Further, a represents the result of the number of times vs threshold voltage, which has been obtained in conventional data writing, b shows the result of the number of times vs threshold voltage, which has been obtained in data writing according to the present invention, c represents the result of the number of times vs threshold voltage, which has been obtained in conventional data erasing, and d shows the result of the number of times vs threshold voltage, which has been obtained in data erasing according to the present invention. Thus, when the number of times in which the data is written and erased in accordance with the conventional method, is about $10^3$, the threshold voltage is brought to −4 V or higher after the erasure of the data. Even when, on the other hand, the number of times in which data is written in accordance with the method of the present invention, is $10^4$ or more, the threshold voltage is brought to $-4$ V or less after the erasure of the data. As a result, the number of times in which the data is reloadable can be improved. Incidentally, the erasure of the data was made in accordance with a drain-tunnel erasing method.

Having now fully described the invention, it will be apparent to those skilled in the art that many changes and modifications can be made without departing from the spirit or scope of the invention as set forth herein.

What is claimed is:

1. A method of writing data into a semiconductor nonvolatile memory having first and second diffusion regions, a control gate and a floating gate disposed over a first channel region which is located on the first diffusion region, and a select gate disposed over a second channel region which is located between the first channel region and the second diffusion region, said method comprising the steps of:

applying a first potential to the control gate so that the first channel region is inverted;

simultaneously applying a second potential to the select gate so that the second channel region is not inverted; and simultaneously applying a third potential to the first diffusion region so that an electric charge is injected from the first diffusion region into the floating gate through the first channel region.

2. A method according to claim 1, wherein the first potential is 10 V or higher, the second potential is 0 V, and the third potential is 0 V.

3. A method according to claim 1, wherein the first potential is a positive voltage and the second potential is a negative voltage, and a voltage difference between the first and second potentials is 10 V or higher.

4. A method according to claim 1, wherein a voltage of the third potential is substantially equal to that of the second potential.

5. A method of writing data into a semiconductor nonvolatile memory having a plurality of word lines, a plurality of bit Lines crossing the word lines, a plurality of select lines being in parallel to the word lines, a plurality of memory cells each one of which has first and second diffusion regions, a control gate, a floating gate disposed over a first channel region which is located on the first diffusion region, and a select gate disposed over a second channel region which is located between the first channel region and the second diffusion region, the first diffusion region being electrically coupled to one of the bit lines, the control gate being electrically coupled to one of the word lines, the select gate being electrically coupled to one of the select lines, said method comprising the steps of:

applying a first potential to a selected one of the word lines so that the first channel regions disposed under the control gates which are electrically coupled to the selected one of the word lines are inverted;

simultaneously applying a second potential to a selected one of the select lines so that the second channel regions disposed under the select gates which are electrically coupled to the selected one of the word lines are not inverted;

simultaneously applying a third potential to a selected one of the bit lines so that an electric charge is injected from the first diffusion region into the floating gate through the first channel region of a selected one of the memory cells which is electrically coupled to the selected bit line and word line; and applying a fourth potential to the bit lines except the selected bit line so that an electric charge is prevented from being injected from the first diffusion region into the floating gate through the first channel region of the memory cells which are not electrically coupled to the selected bit line and word line.

6. A method according to claim 5, wherein a voltage of the first potential is 10 V or higher, a voltage of the second potential is 0 V, and a voltage of the third potential is 0 V.

7. A method according to claim 5, wherein the first potential is a positive voltage and the second potential is a negative voltage, and a voltage difference between the first and second potentials is 10 V or higher.

8. A method according to claim 5, wherein a voltage of the third potential is substantially equal to that of the second potential.

9. A method according to claim 5, wherein a voltage of the third potential is lower than that of the fourth potential.

10. A method according to claim 1, wherein the injection of charge into the floating gate is caused by a Fowler/Nordheim tunnel current.

11. A method according to claim 5, wherein the injection of charge into the floating gate of the selected memory cell which is electrically coupled to the selected bit line and word line is caused by a Fowler/Nordheim tunnel current.

* * * * *